(12) United States Patent
He et al.

(10) Patent No.: US 9,615,474 B2
(45) Date of Patent: Apr. 4, 2017

(54) DEVICE FOR QUICK SPLICING OF A DISPLAY SCREEN

(71) Applicant: SHENZHEN AOTO ELECTRONICS CO., LTD, Shenzhen (CN)

(72) Inventors: Jinlong He, Chengdu (CN); Qiquan Wang, Shenzhen (CN); Zhihui Liu, Shenzhen (CN); Zhenzhi Wu, Shenzhen (CN); Yi Shen, Shenzhen (CN); Hanqu Wu, Shenzhen (CN)

(73) Assignee: SHENZHEN AOTO ELECTRONICS CO., LTD, Shenzhen (CN)

( * ) Notice: Subject to any disclaimer, the term of this patent is extended or adjusted under 35 U.S.C. 154(b) by 112 days.

(21) Appl. No.: 14/394,011

(22) PCT Filed: Dec. 25, 2012

(86) PCT No.: PCT/CN2012/087416
§ 371 (c)(1),
(2) Date: Oct. 10, 2014

(87) PCT Pub. No.: WO2014/059734
PCT Pub. Date: Apr. 24, 2014

(65) Prior Publication Data
US 2015/0078812 A1 Mar. 19, 2015

(30) Foreign Application Priority Data
Oct. 16, 2012 (CN) .................. 2012 2 0528045 U (51) Int. Cl.
*H05K 5/02* (2006.01)
*F16M 11/08* (2006.01)
(Continued)

(52) U.S. Cl.
CPC ......... *H05K 5/0221* (2013.01); *F16B 5/0084* (2013.01); *F16M 11/041* (2013.01);
(Continued)

(58) Field of Classification Search
CPC .... H05K 5/0221; F16M 11/041; F16M 11/08; F16M 13/02; F16B 5/0084;
(Continued)

(56) References Cited

U.S. PATENT DOCUMENTS 5,687,939 A * 11/1997 Moscovitch ........... F16M 11/12
248/122.1
5,824,007 A * 10/1998 Faraz .................... F16M 11/046
600/102
(Continued)

FOREIGN PATENT DOCUMENTS

| | | |
|---|---|---|
| CN | 201957366 | 8/2011 |
| CN | 102339569 | 2/2012 |
| EP | 1728951 | 12/2006 |

*Primary Examiner* — James Ference
(74) *Attorney, Agent, or Firm* — Hamre, Schumann, Mueller & Larson, P.C.

(57) ABSTRACT

A device for quick splicing of a display screen is provided. The device includes a left assembly and a right assembly. The left assembly includes a rotation fixing seat, a rotation angle seat, a rotation locking mechanism, and a step angle-adjusting and clamping mechanism. The rotation angle seat can lock with the right assembly, and is rotatably connected to the rotation fixing seat. The rotation locking mechanism is disposed between the rotation fixing seat and the rotation angle seat. When the rotation locking mechanism is unlocked, the rotation angle seat can rotate relative to the rotation fixing seat; and when the rotation locking mechanism is locked, the rotation angle seat is fixedly connected to the rotation fixing seat. The step angle-adjusting and clamping mechanism is disposed between the rotation angle seat and the rotation fixing seat.

8 Claims, 9 Drawing Sheets

(51) Int. Cl.
  *G09F 9/302* (2006.01)
  *G09F 9/00* (2006.01)
  *F16M 11/04* (2006.01)
  *F16M 13/02* (2006.01)
  *F16B 5/00* (2006.01)
  *F16B 2/18* (2006.01)

(52) U.S. Cl.
  CPC ............ *F16M 11/08* (2013.01); *F16M 13/02* (2013.01); *G09F 9/00* (2013.01); *G09F 9/3026* (2013.01); *F16B 2/185* (2013.01); *F16B 5/0092* (2013.01); *Y10T 403/595* (2015.01)

(58) Field of Classification Search
  CPC .......... F16B 5/0092; F16B 2/185; G09F 9/00; G09F 9/3026; Y10T 403/595
  USPC ...... 248/917, 919, 122.1, 921, 124.1, 278.1, 248/298.1, 920, 922; 403/322.4
  See application file for complete search history.

(56) References Cited

U.S. PATENT DOCUMENTS

| | | | | |
|---|---|---|---|---|
| 5,904,328 A * | 5/1999 | Leveridge | ............... | F16M 11/10 248/124.1 |
| 6,059,255 A * | 5/2000 | Rosen | ................... | B60K 35/00 248/291.1 |
| 6,554,238 B1 * | 4/2003 | Hibberd | ............... | A47B 81/061 248/278.1 |
| 7,061,754 B2 * | 6/2006 | Moscovitch | ........... | F16M 11/00 248/917 |
| 7,331,551 B2 * | 2/2008 | Oddsen, Jr. | ............ | F16M 11/04 248/278.1 |
| 7,369,401 B1 * | 5/2008 | Floersch | ................ | F16M 11/04 292/301 |
| 7,529,083 B2 * | 5/2009 | Jeong | ................... | F16M 11/105 248/917 |
| 7,607,620 B2 * | 10/2009 | Ozolins | ................. | F16M 11/08 248/122.1 |
| RE42,091 E * | 2/2011 | Moscovitch | ........... | B60R 11/02 348/794 |
| 7,922,132 B2 * | 4/2011 | Saez | ...................... | F16M 11/04 248/124.1 |
| 8,083,189 B2 * | 12/2011 | Sun | ........................ | F16M 11/08 248/122.1 |
| 8,282,052 B2 * | 10/2012 | Huang | ................. | F16M 11/045 248/125.1 |
| 8,596,599 B1 * | 12/2013 | Carson | ............... | B60R 11/0235 211/26 |
| 2003/0015632 A1 * | 1/2003 | Dunn | ................... | A47B 81/065 248/122.1 |
| 2006/0238967 A1 * | 10/2006 | Carson | ............... | B60R 11/0235 361/679.04 |
| 2006/0278234 A1 * | 12/2006 | Maatta | ................. | G06F 1/1616 128/206.19 |
| 2007/0097617 A1 * | 5/2007 | Searby | ................... | F16M 11/04 361/679.4 |
| 2009/0065667 A1 * | 3/2009 | Bakkom | .................. | E05D 3/12 248/205.1 |
| 2009/0309819 A1 * | 12/2009 | Elliott | ................... | G06F 3/1446 345/82 |
| 2010/0116961 A1 * | 5/2010 | Moscovitch | ........... | F16M 11/00 248/371 |
| 2010/0128423 A1 * | 5/2010 | Moscovitch | ........... | F16M 11/04 361/679.01 |
| 2011/0019348 A1 * | 1/2011 | Kludt | ........................ | F16B 2/12 361/679.01 |

* cited by examiner

DEVICE FOR QUICK SPLICING OF A DISPLAY SCREEN

TECHNICAL FIELD

The present invention relates to a LED displaying technology field, in particular, to a device for quick splicing of a display screen.

BACKGROUND

Generally, a LED display is formed by splicing a plurality of display screen unit cases or display unit cases. With the development of technology and the improvement of display accuracy, it requires not only a fast and convenient splicing for the screen, but also requires a higher precision, otherwise it will affect the display quality. Generally, the existing screen is spliced directly depend on the outline of the case, and subject to the accuracy of the present sheet metal processing equipment and the characteristics of sheet metal processing technology and other factors, it is difficult to guarantee the splicing spaces in a horizontal direction (x), vertical direction (y), and the front-rear direction (z) to be in an ideal state, generally the assembling error is often greater than 1 mm. Especially, for the high density pixel screen, the assembling error will directly lead to an obvious bright line or dark line on the position where the splicing line is located, causing a poor display effect. The shape of LED display screen is more diversified, in order to meet the requirements of the market, the shape of the screen is no longer flat, the screen needs to be spliced to form a outer arc, inner arc and wavy shapes, etc.

A device for quick splicing of a display screen being able to splice the arc screen is disclosed in the china patent application 201220463653.X, but the device for quick splicing of a display screen provides a stepless adjustment, in theory two pieces of screens can be spliced into a arbitrary angle within a certain angle, however actually during the specific operation of the application, an operator can not know which angle should the screen be spliced into, which leads to a trouble for the splicing process.

From what has been discussed above, the existing technology of device for quick splicing of a display screen can not achieve a step adjustment, which brings inconvenience to the splicing process, thus it needs to be improved.

SUMMARY

The present invention aims at providing a device for quick splicing of a display screen for splicing the arc screen quickly, to solve the problem that the screen can not be spliced into an arc screen conveniently and accurately.

To solve the above mentioned problem, the present invention provides the following technical solution:

A device for quick splicing of a display screen comprising a left assembly and a right assembly, the left assembly and the right assembly being lockable with each other, the left assembly comprising a rotation fixing seat, a rotation angle seat, and a rotation locking mechanism, the rotation angle seat being lockable with the right assembly, and being rotatably connected to the rotation fixing seat; the rotation locking mechanism being disposed between the rotation fixing seat and the rotation angle seat; when the rotation locking mechanism is unlocked, the rotation angle seat rotates relative to the rotation fixing seat; and when the rotation locking mechanism is locked, the rotation angle seat is fixedly connected to the rotation fixing seat. The device for quick splicing of a display screen further comprises a step angle-adjusting and clamping mechanism, the step angle-adjusting and clamping mechanism is disposed between the rotation angle seat and the rotation fixing seat.

In a preferred technical solution, the rotation angle seat is provided with a arc-shaped flange, and the rotation fixing seat is correspondingly provided with arc-shaped flange guiding slot, the arc-shaped flange is slidable in the arc-shaped flange guiding slot, such that the rotation fixing seat and the rotation angle seat are rotatable with respective to each other, the rotation locking mechanism comprises a locking plate and a locking driving mechanism, the rotation fixing seat is provided with a guide column, the locking plate is inserted by the guide column, through the guide column, the locking plate is slidably disposed on the rotation fixing seat; the step angle-adjusting and clamping mechanism comprises arc-shaped tooth portions disposed on the locking plate and accordingly disposed on the arc-shaped flange of the rotation angle seat; the locking driving mechanism drives the locking plate to approach to the rotation angle seat, such that the arc-shaped tooth portions of the locking plate and the rotation angle seat engage with each other to prevent the rotation fixing seat from rotating with respective to the rotation angle seat.

In a further preferred technical solution, the locking driving mechanism comprises: a set shaft, a locking spanner and a spiral curved surface disposed on the rotation fixing seat; one end of the set shaft is provided with a handgrip, the other end of the set shaft is provided with a spanner connecting hole; the locking spanner is connected to the set shaft through the spanner connecting hole, and the spiral curved surface is tangent to a cylinder surface of the locking spanner; after assembled, the spiral curved surface and the rotation fixing seat is arranged between the handgrip and the locking spanner, the locking spanner is moved to slide on the spiral curved surface thereby driving the locking plate to approach to the rotation angle seat so as to lock the rotation fixing seat and the rotation angle seat.

In a further preferred technical solution, the number of the guide column is three, and the guide columns are distributed as triangle.

In a preferred technical solution, the device for quick splicing of a display screen further comprises an angle indication mechanism indicating the relative rotation angle of the rotation fixing seat and the rotation angle seat, and the angle indication mechanism is disposed between the rotation fixing seat and the rotation angle seat.

In a further preferred technical solution, the angle indication mechanism comprises an angle pointer fixedly disposed on the rotation angle seat, and an angle reading disposed on an outer side curved surface of the arc-shaped flange guiding slot of the rotation fixing seat.

In a further preferred technical solution, the angle indication mechanism further comprises a plurality of pointer slot disposed on the outer side curved surface of the arc-shaped flange guiding slot, the pointer slot is disposed on one side of the angle reading and is corresponding to the scale of the angle reading, and the angle pointer is elastic angle pointer.

In a preferred technical solution, the left assembly further comprises a locking reset mechanism, when the locking reset mechanism unlocks the rotation locking mechanism, the rotation angle seat and the rotation fixing seat are disengaged automatically from each other and enter into a relative rotation state, the locking reset mechanism is disposed between the rotation angle seat and the rotation fixing seat.

In a preferred technical solution, the left assembly further comprises a rotation limiting mechanism restricting the rotation fixing seat and the rotation angle seat in a definite range, the rotation limiting mechanism is disposed between the rotation fixing seat and the rotation angle seat.

In a further preferred technical solution, the rotation limiting mechanism a limiting screw and a limiting groove respectively disposed on the rotation fixing seat and the rotation angle seat; when the rotation fixing seat rotates with respective to the rotation angle seat and reaches a limiting position, the limiting screw contacts with the limiting groove to define the limiting position that the rotation fixing seat can rotate with respective to the rotation angle seat.

In a preferred technical solution, the rotation angle seat is provided with a X-direction left positioning surface, and the X-direction left positioning surface is provided with a positioning column hole; the right assembly comprises a right seat body, a spanner, a drag hook, a positioning column; the right seat body is provided with a X-direction right positioning surface corresponding to the X-direction left positioning surface, and the X-direction right positioning surface is provided with a positioning column accommodating hole, the positioning column accommodating hole corresponds to the positioning column hole, one end of the spanner is rotatably connected to the right seat body; the positioning column is slidably accommodated in the positioning column accommodating hole; the drag hook and the positioning column are rotatably connected to a middle portion of the spanner; when the spanner is thrown, the drag hook hooks the left assembly and meanwhile the positioning column is inserted into the positioning column hole.

In a further preferred technical solution, the device for quick splicing of a display screen further comprises a safety mechanism, the safety mechanism is disclosed between a moving part and a stationary part of the right assembly; the moving part comprises the spanner, the drag hook and the positioning column, the stationary part comprises the right seat body.

In a further preferred technical solution, the safety mechanism comprises a safety buckle, a safety buckle reset member and a safety buckle rotation shaft; the safety buckle is rotatably disclosed on the right seat body through the safety buckle rotation shaft, the safety buckle reset member is a reset spring which sleeves the safety buckle rotation shaft and elastically act on the safety buckle and the right seat body; the safety buckle may lock the moving part and may remain the lock state under the action of the safety buckle reset member.

In a further preferred technical solution, the safety buckle comprises a clamp hook, and the spanner is correspondingly provided with a clamp hook hole for accommodating the clamp hook; and the safety buckle fastens the spanner through the clamp hook.

In a further preferred technical solution, the clamp hook comprises a guide slant. In a further preferred technical solution, the safety buckle comprises a pressing surface for pressing operation; when the pressing surface is pressed, the safety buckle can overcome the action of the reset spring to rotate about the safety buckle rotation shaft and then break away from the spanner.

In a preferred technical solution, the right assembly further comprises a positioning column connecting shaft, the positioning column comprises a positioning column body and a connecting piece fixedly connected with the positioning column body; the positioning column is rotatably connected to the spanner through the connecting piece and the positioning column connecting shaft, such that when the spanner is thrown, the drag hook hooks the left assembly and meanwhile the positioning column be inserted into the positioning column hole.

In a preferred technical solution, a front end of the positioning column body is provided with a conical surface that plays a guide role; the connecting piece is provided with a waist-shaped hole; and the positioning column connecting shaft rotatably connects the positioning column with the spanner through the waist-shaped hole.

In a preferred technical solution, the right assembly further comprises open state remaining member which make the right assembly keep the maximum open state when the drag hook doesn't hook the left assembly; the open state remaining member is disposed between the moving part and the stationary part of the right assembly; the moving part comprises the moving part comprises the spanner, the drag hook and the positioning column; and the stationary part comprises the right seat body.

In a further preferred technical solution, the open state remaining member is a tension spring which acts between the positioning column and the right seat body and pulls the positioning column to the right seat body to ensure that the positioning column doesn't protrude above the X-direction right positioning surface in the unlock state.

In a preferred technical solution, the quick splicing device of a display further comprises a guide mechanism; the right size and the left side of the right seat body respectively comprise a side wall. The guide mechanism comprises guide grooves disposed on the side walls and guide pins disposed on the two sides of the drag hook; the guide pin is arranged in the guide groove and is slidable along the guide groove.

In a further preferred technical solution, the guide pin and the drag are formed in a whole, and an upper side of the guide groove is provided with a mounting gap facilitating mounting the guide pin to the guide groove.

In a further preferred technical solution, the left assembly further comprises a locking column, the locking column is disposed on the rotation angle seat; and the drag hook hooks the left assembly by hooking the locking column.

The beneficial effect of the present invention is that:

Owing to the step angle-adjusting and clamping mechanism, the step adjustment of a splicing angle may be realized, an operator is preinformed what is the angle value to be spliced, thus facilitating splicing.

The present invention is described in detail below with reference to the drawings.

DETAILED DESCRIPTION

The purpose of the present invention is to provide a device for quick splicing of a display screen that can splice an arc display screen quickly without any tool but can achieve a high precision splicing effect. And this device for quick splicing of a display screen can be manufactured on a large scale and is especially suitable for the splicing of the display screen which has high density pixels and needs to be assembled and disassembled frequently.

Figure 1:
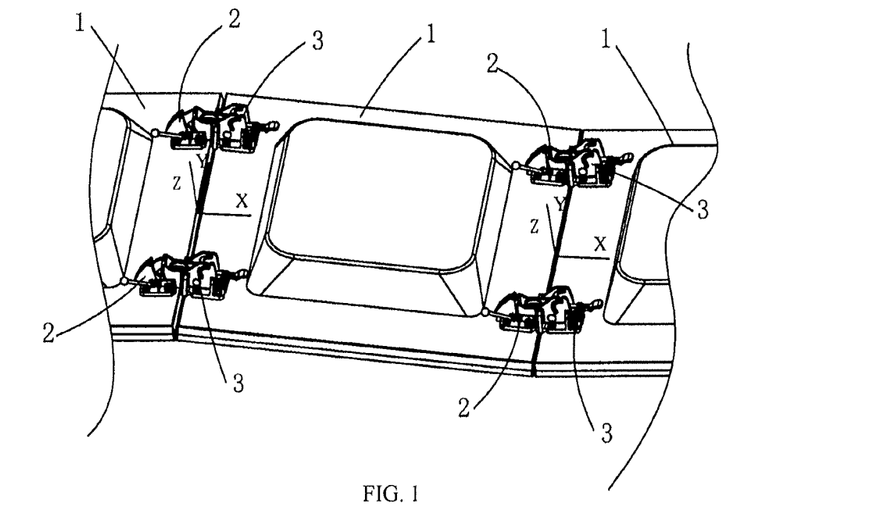
FIG. 1 is a reference view of the state in use of a device for quick splicing of a display screen according to a specific embodiment of the present invention.
Figure 2:
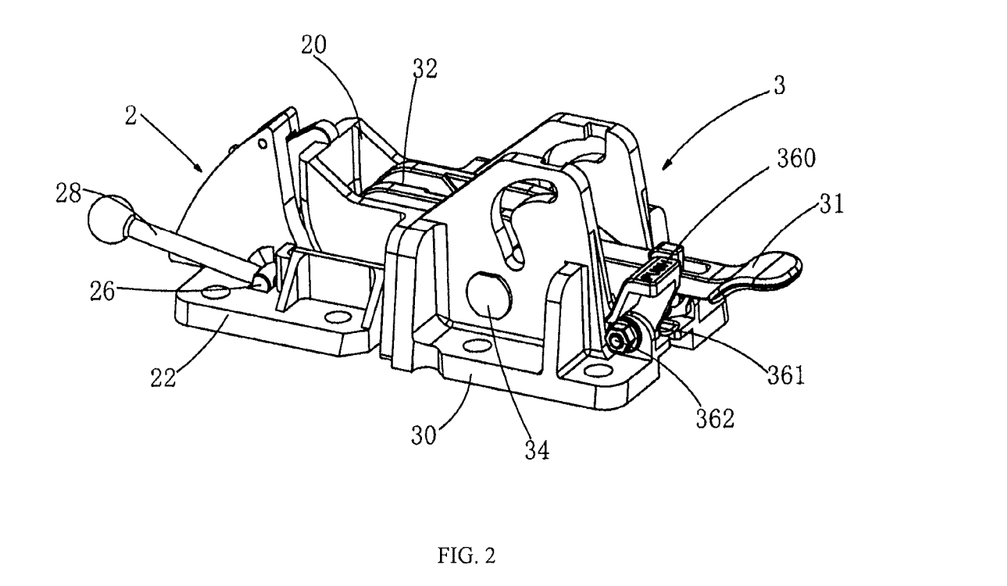
FIG. 2 is a perspective structure schematic view of the quick splicing device of a display screen in the lock state according to a specific embodiment of the present invention.
Figure 3:
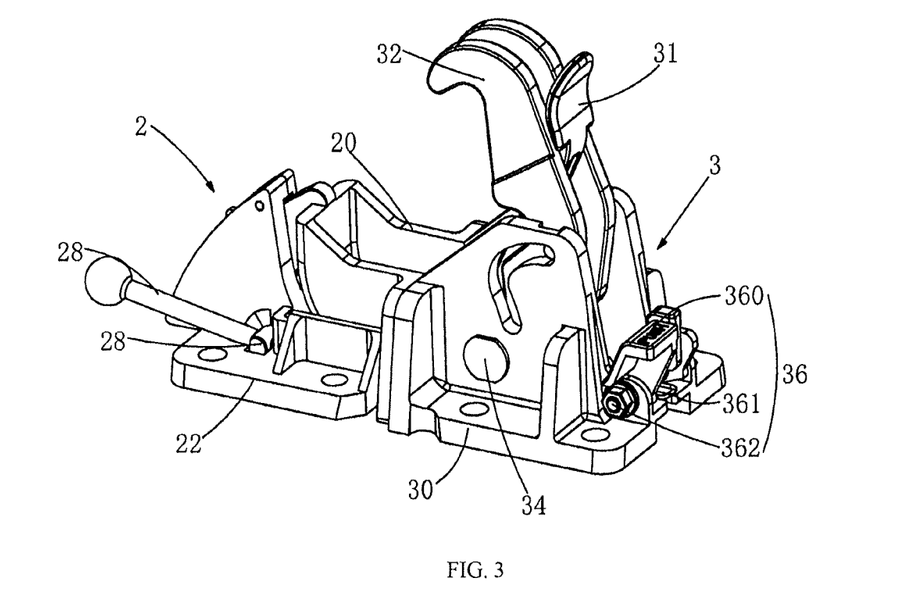
FIG. 3 is a perspective structure schematic view of the quick splicing device of a display screen in unlock state according to a specific embodiment of the present invention.
Figure 4:
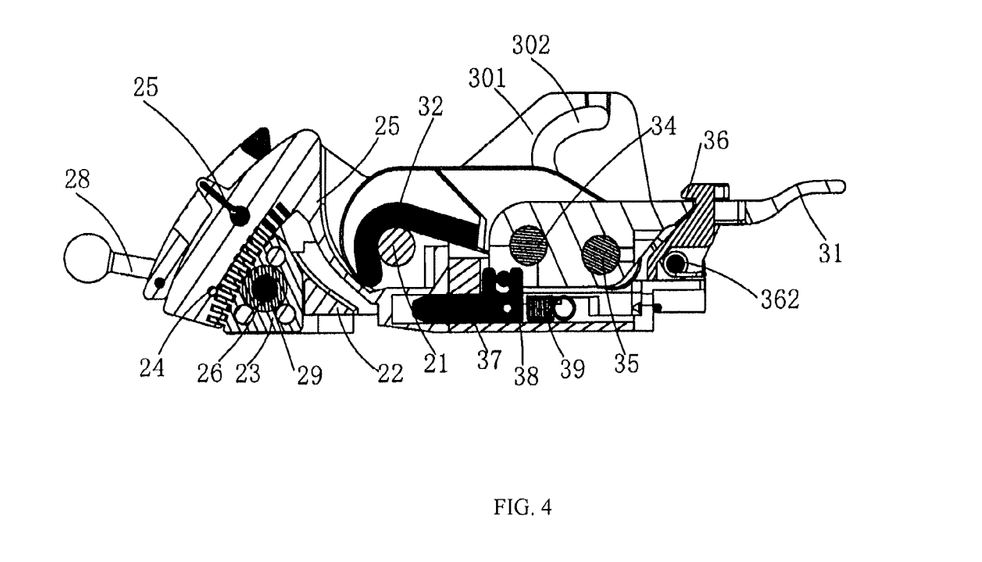
FIG. 4 is a cross-section view of an axial plane of the quick splicing device of a display screen in unlock state according to a specific embodiment of the present invention.
Figure 5:
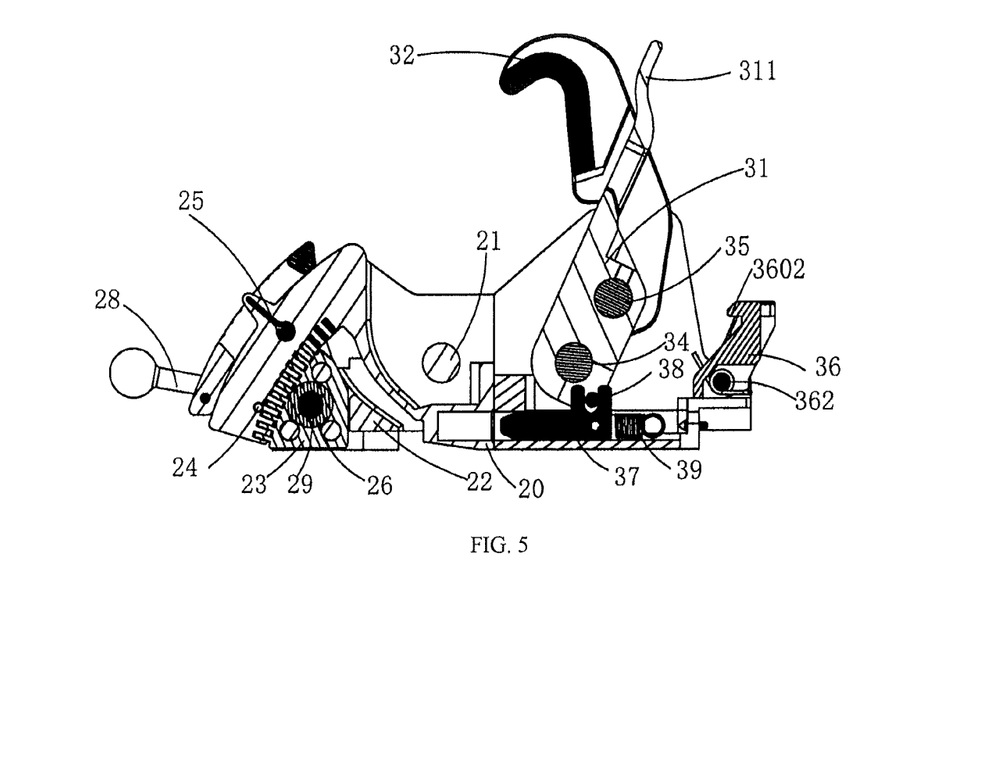
FIG. 5 is a cross-section view of the axial plane of the quick splicing device of a display screen in lock state according to a specific embodiment of the present invention.
Figure 6:
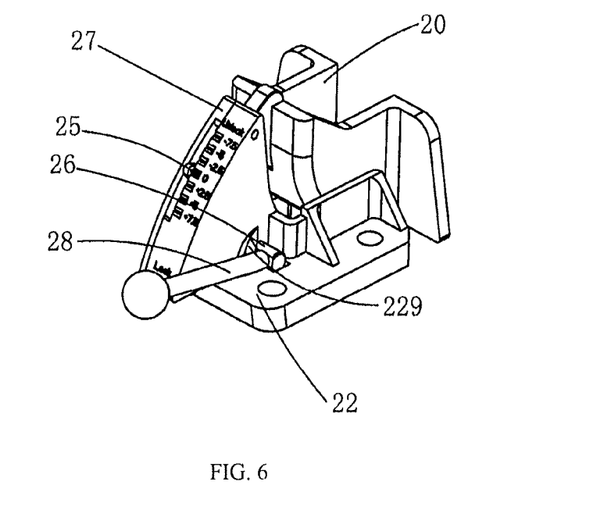
FIG. 6 is a perspective structure schematic view of the left assembly according to a specific embodiment of the present invention.
Figure 7:
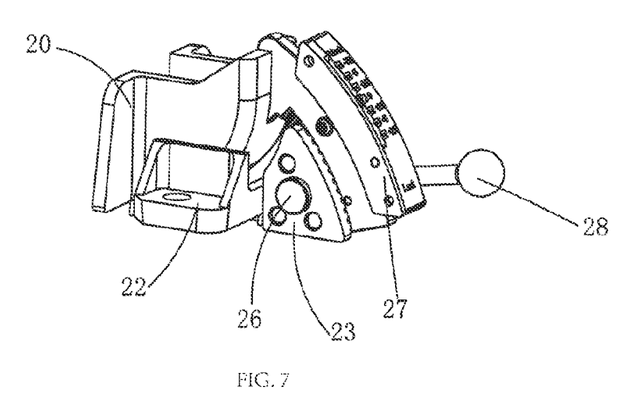
FIG. 7 is another perspective structure schematic view of the left assembly according to a specific embodiment of the present invention.
Figure 15:
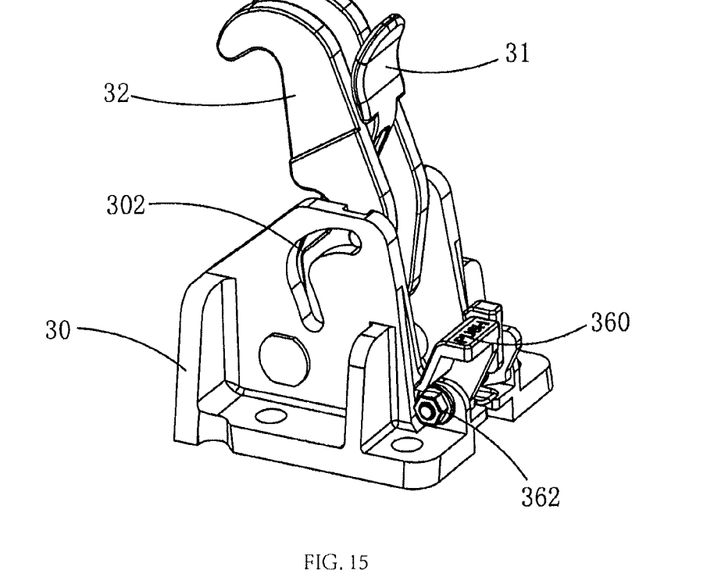
FIG. 15 is a perspective structure schematic view of the right assembly according to a specific embodiment of the present invention.

FIG. 1 is a reference view of the state in use of a device for quick splicing a display screen according to a specific embodiment of the present invention. The device for quick splicing a display screen is disposed between two display units 1 (or display unit cases), for quick fixing and connecting the two adjacent display units 1. From FIG. 1 it can be seen that a certain angle exists between two adjacent display units 1 through the device for quick splicing a display screen, thereby forming an arc screen. Referring to FIG. 2 to FIG. 5, the device for quick splicing a display screen comprises a left assembly as shown in FIG. 6 or 7 and a right assembly as shown in FIG. 15, the left assembly and the right assembly are lockable with each other. After assembled, the left assembly 2 and the right assembly 3 are respectively fixedly connected to one display unit, and then the right assembly 3 is locked with the left assembly 2, such that the two display units are spliced together. The unlock states are shown in FIG. 3 and FIG. 5, and the lock states are shown in FIG. 2 and FIG. 4. According to the size of the display unit 1 and other specific situations, as shown in FIG. 1, two devices for quick splicing a display screen may be disposed between two adjacent display units 1. In other embodiment, only one device for quick splicing a display screen or more than two divides for quick splicing a display screen may be arranged.

Figure 8:
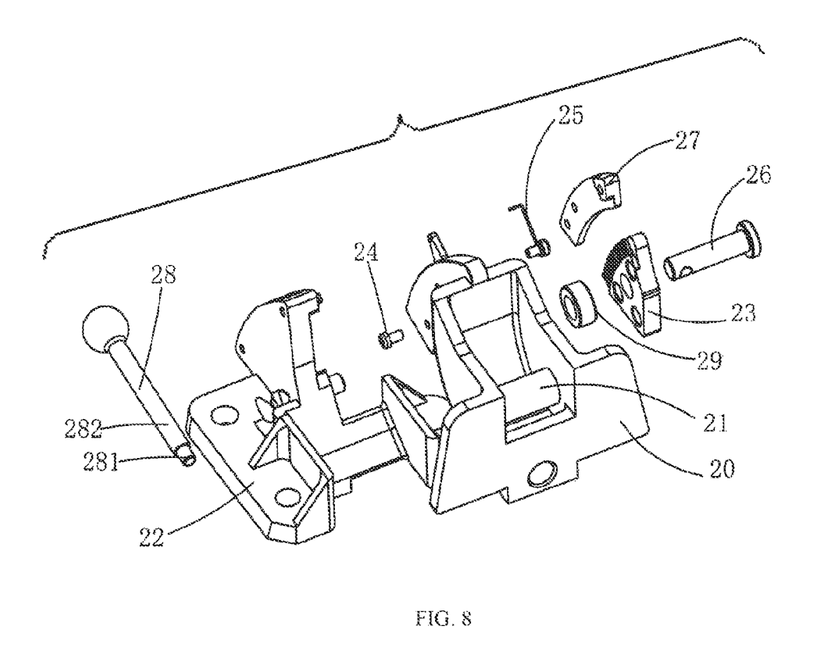
FIG. 8 is an explosive view of the left assembly according to a specific embodiment of the present invention.

The specific structure of the left assembly 2 is shown in FIGS. 6, 7 and 8. The left assembly 2 comprises a rotation fixing seat 22, a rotation angle seat 20 and a rotation locking mechanism. The rotation angle seat 20 is provided with a locking column 21, and the rotation angle seat 20 is locked with the right assembly 3 through the locking column 21. The rotation angle seat 20 is rotatably connected to the rotation fixing seat 22. When the rotation locking mechanism is unlocked, the rotation angle seat 20 rotates with respective to the rotation fixing seat 22; and when the rotation locking mechanism is locked, the rotation angle seat 20 is fixedly connected to the rotation fixing seat 22.

Figure 9:
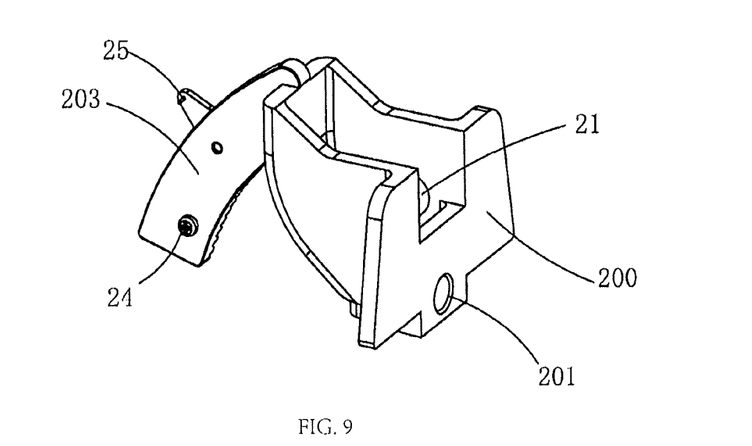
FIG. 9 is a perspective structure schematic view of the rotation angle seat according to a specific embodiment of the present invention.
Figure 10:
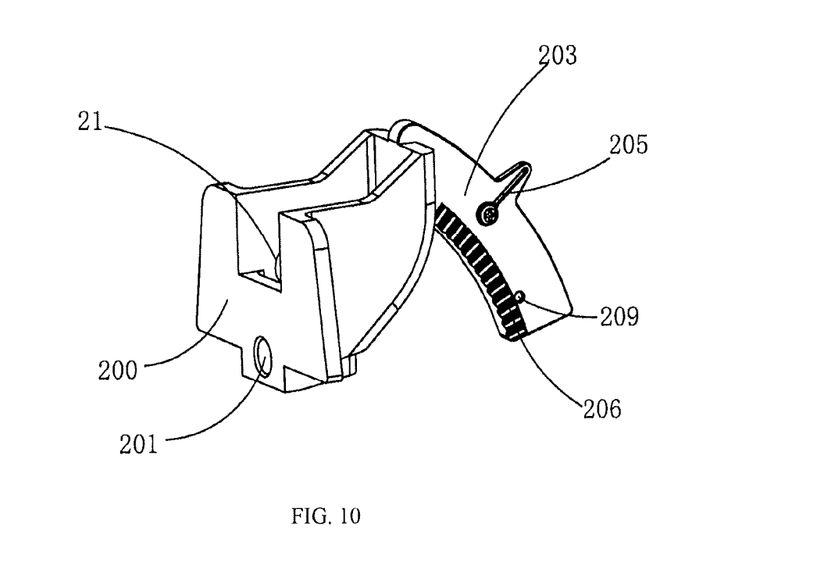
FIG. 10 is another perspective structure schematic view of the rotation angle seat according to a specific embodiment of the present invention.
Figure 11:
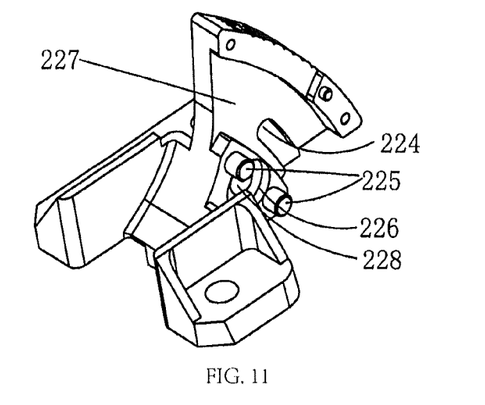
FIG. 11 is a perspective structure schematic view of the rotation fixing seat according to a specific embodiment of the present invention.

The specific structure of the rotation angle seat 20 is shown in FIG. 9 and FIG. 10, the front side of the rotation angle seat 20 has an X-direction left positioning surface 200, and the X-direction left positioning surface 200 defines a positioning column hole 201. As shown in FIG. 9 or FIG. 10, the rotation angle seat 20 is provided with an arc shaped flange 203. As shown in FIG. 11, the rotation fixing seat 11 is correspondingly provided with an arc-shaped flange guiding slot 227, the arc-shaped flange 203 is slidable in the arc-shaped flange guiding slot 227, such that the rotation fixing seat 22 and the arc-shaped flange guiding slot 20 can be rotated with respective to each other.

As shown in FIG. 7 and FIG. 8, the rotation locking mechanism comprises a locking plate 23, a set shaft 26 and a locking spanner 28. As shown in FIG. 11, the rotation fixing seat 22 is provided with three guide columns 225, and the three guide columns are distributed as a triangle. The device for quick splicing a display screen further comprises a step angle-adjusting and clamping mechanism, the step angle-adjusting and clamping mechanism is disposed between the rotation angle seat 20 and the locking plate 23. The step angle-adjusting and clamping mechanism comprises arc-shaped tooth portions 231 and 206 respectively disposed on the locking plate 23 and the arc-shaped flange 203 of the rotation angle seat 20; the locking driving mechanism may drive the locking plate 23 to approach to the rotation angle seat 20, such that the arc-shaped tooth portions 231 and 206 of the locking plate and the rotation angle seat engage with each other to prevent the rotation fixing seat 22 from rotating with respective to the rotation angle seat 20.

A display screen may be spliced quickly without any tool by using the device for quick splicing a display screen of the present invention. And through the innovative structure design that transfers the contact parts, the damage caused by the squeeze of two adjacent display units may be prevented. More importantly, the main parts may be manufactured through the die casting process cooperated with the machining process. The contact parts for assembly are precisely machined and are applied by a processing technology control, the manufacturing precision of the contact parts may be within 0.02 mm. After assembled, the total error may be controlled to be within the range of 0.1 mm, which improves the splicing precision by one order of magnitude, and can achieve an ideal effect of splicing, thereby achieving accurate assembly and locking, to adapt to the display application of high density of pixels. In the specific embodiment of the device for quick splicing a display screen, owing to the step angle-adjusting and clamping mechanism, the step adjustment of a splicing angle may be realized, an operator can be preinformed what is the angle value to be spliced, thus facilitating splicing.

Figure 13:
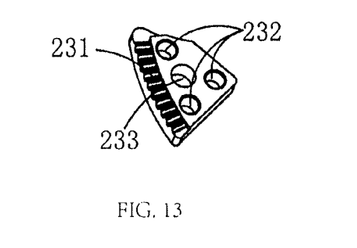
FIG. 13 is a perspective structure schematic view of the locking plate according to a specific embodiment of the present invention.

As shown FIG. 13, the locking plate 23 accordingly defines three guide column holes 232. Through the guide column hole 232, the locking plate 23 may be slidably disposed on the guide column 225 of the rotation fixing seat 22. And as shown in FIG. 13, the locking plate 23 is provided with the arc-shaped tooth portion 231, the indexing angle of each tooth of the arc-shaped tooth portion 231 corresponds to the angle of one step rotation of the angle seat 20. In a preferred technical solution, the indexing angle of each tooth is 2.5 degrees, the angle adjusting range is between plus and minus 7.5 degrees. Each tooth may index any other angle according to the design need. As shown in FIG. 10, the arc-shaped flange 203 of the rotation angle seat 20 is correspondingly provided with the arc-shaped tooth portion 206 matched with the arc-shaped tooth portion 231, the indexing angle of each tooth of the arc-shaped tooth portion 206 is also 2.5 degrees.

Figure 12:
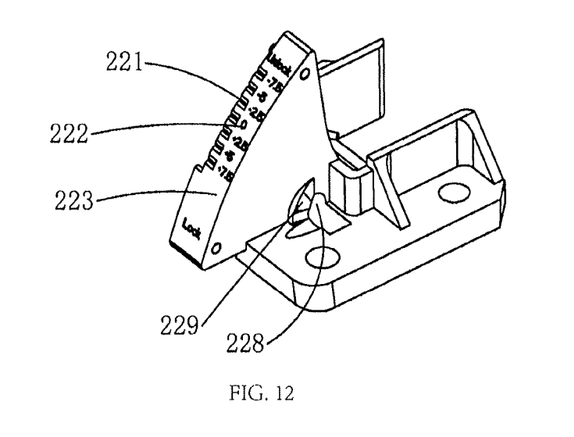
FIG. 12 is another perspective structure schematic view of the rotation fixing seat according to a specific embodiment of the present invention.
Figure 14:
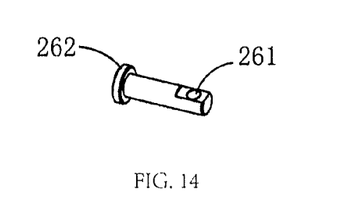
FIG. 14 is a perspective structure schematic view of the set shaft according to a specific embodiment of the present invention.

As shown in FIG. 14, one end of an set shaft 26 is provided with a larger handgrip 262 to prevent the set shaft 26 from escaping from the set shaft hole 233 of the locking plate 23; the other end of the set shaft 26 defines a spanner connecting hole 261 for connecting to the locking spanner 28. An axis of the spanner connecting hole 261 is perpendicular to an axis of the set shaft 26, the locking spanner 28 may be thrown to make the set shaft 26 rotate about the axis thereof. It should be noted especially that rotating the set shaft 26 isn't the final purpose, the set shaft 26 is rotated to make the locking plate 23 lock the rotation angle seat 20 and the rotation fixing seat 22, such that the rotation angle seat 20 can't be rotated with respective to the rotation fixing seat 22. For that purpose, as shown in FIG. 6 or 12, a spiral curved surface 229 is arranged on a part of the rotation fixing seat 22 close to the set shaft hole 228, and the spiral curved surface 229 is tangent to a cylinder surface 282 of the locking spanner 28. Thus when the locking spanner 28 is thrown, under the drive of the elevating force from the spiral curved surface 229, the locking plate 23 is driven to approach to the rotation fixing seat 22, the locking plate 231 of the locking plate 23 engages with the arc-shaped tooth portion 206 of the rotation angle seat 20, such that the rotation fixing seat 22 can't be rotated with respective to the rotation angle seat 20. Such that the rotation angle seat 20 is fixedly connected to the rotation fixing seat 22.

A specific embodiment is shown in FIGS. 7 and 8, the left assembly 2 further comprises an angle indication mechanism indicating the relative rotation angle of the rotation fixing seat 22 and the rotation angle seat 20, and the angle indication mechanism is disposed between the rotation fixing seat 22 and the rotation angle seat 20. The angle indication mechanism comprises an angle pointer 25, a plurality of pointer slots 221 disposed on an outer side curved surface 223 of the arc-shaped flange guiding slot 227 of the rotation fixing seat 22 and limiting the angle of each step, and a corresponding angle reading 222 disposed on one side of the pointer slot 221. An angle indicating spring 25 is fixedly mounted on the rotation angle seat 20, and in this specific embodiment an elastic angle pointer 25 is used. When the locking plate 23 is released through the locking spanner 28, the rotation angle seat 20 may be rotated with respective to the rotation fixing seat 22, then the angle pointer 25 may be slid on the outer side curved surface 223 and drop in respective pointer slot 221, thereby indicating the angle of rotation under the cooperation of the angle reading 222. Because the angle pointer 25 has elasticity, when the rotation angle seat 20 is rotated with respective to the rotation fixing seat 22, if the rotation angle seat 20 is rotated one step, the angle pointer 25 is slid from one pointer slot 221 to another pointer slot 221, and makes a "click" sound, which can help the operator to determine the rotation angle without reading the angle reading 222 in poor light environment, and the operating feel is better.

A further preferred technical solution is shown in FIG. 7 and FIG. 8, the angle indication mechanism further comprises a pointer backplate 27, the pointer backplate 27 is fixedly disposed on the rotation fixing seat 22 and is on the outer side of the angle pointer 25. A protection space for accommodating the angle pointer 25 is formed between the pointer backplate 27 and the rotation fixing seat 22, and prevents an outside object from contacting the angle pointer 25 and causing damage or causing that the angle pointer 25 can't indicate the rotation angle correctly.

The left assembly 2 further comprises a locking reset mechanism configured for making the rotation angle seat 20 and the rotation fixing seat 22 disengage automatically from each other and enter into a relative rotation state when the rotation locking mechanism is unlocked, the locking reset mechanism is disposed between the locking plate 23 and the rotation fixing seat 22. In this specific embodiment, the locking reset mechanism is an elastic reset member disposed between the rotation fixing seat 22 and the locking plate 23. When the rotation locking mechanism is locked, the elastic reset member is compressed between the rotation fixing seat 22 and the locking plate 23. Referring to FIGS. 8, 4 and 5, more specifically, the elastic reset member is a rubber spring 29 made of elastic rubber. From FIG. 11, it can be seen that a rubber spring accommodating hole 226 is defined near the guide column 225. After assembled, the rubber spring 29 is in the rubber spring accommodating hole 226 with a part extending outwards from the rubber spring accommodating hole 226. When the locking spanner 28 is thrown, under the drive of the elevating force from the spiral curved surface 229 of the rotation fixing seat 22, the rubber spring 29 is compressed after the locking plate 23 is locked through the set shaft 26. After the locking bolt 26 is released, the locking plate 23 escapes from the rotation angle seat 20 due to the recovering of the rubber spring 29. A normal metal spring may be used to replace the rubber spring 29, which can basically achieve the same technical effect.

Form FIGS. 8, 9, 11, 4 and 5, it can be seen that the left assembly further comprises a rotation limiting mechanism configured for restricting the rotation fixing seat and the rotation angle seat in a definite range, the rotation limiting mechanism is disposed between the rotation fixing seat 22 and the rotation angle seat 20. The rotation limiting mechanism comprises a limiting screw 24 disposed in an limiting screw hole 209 in the rotation fixing seat 20 and a limiting groove 224 disposed on the rotation fixing seat 22. When the rotation fixing seat 22 rotates with respective to the rotation angle seat 20 and reaches a limiting position, the limiting screw 24 contacts with the end of the limiting groove 224 to define the limiting position that the rotation fixing seat 22 can rotate with respective to the rotation angle seat 20.

Referring to FIGS. 15, 4 and 5, the right assembly 3 comprises a right seat body 30, a spanner 31, a drag hook 32, a spanner rotation shaft 34, a drag hook rotation shaft 35, a positioning column 37, a positioning column connecting shaft 38 and so on.

Figure 16:
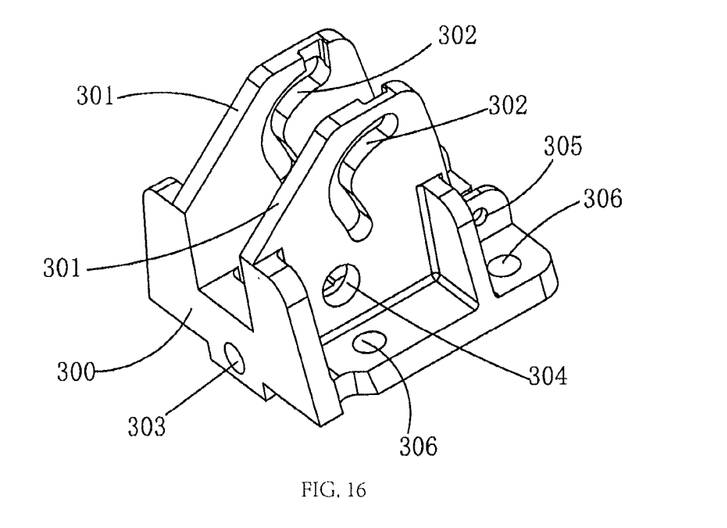
FIG. 16 is a perspective structure schematic view of the right seat body according to a specific embodiment of the present invention.

The specific structure of the right seat body 30 is shown in FIG. 16, the front side of the right seat body is provided with an X-direction right positioning surface 300 corresponding to the X-direction left positioning surface 200, and the X-direction right positioning surface 300 defines a positioning column accommodating hole 303 accommodating the positioning column 37. The position of positioning column accommodating hole 303 corresponds to the positioning column hole 201. The right side and the left side of the right seat body 30 respectively comprise a side wall 301. Each side wall 301 defines a guide groove 302, a spanner rotation shaft hole 304 and a safety buckle rotation shaft hole 305. The bottom of the right seat body 30 defines a plurality of mounting holes 306 configured to be fixedly connected to the display unit 1 through a bolt.

Figure 18:
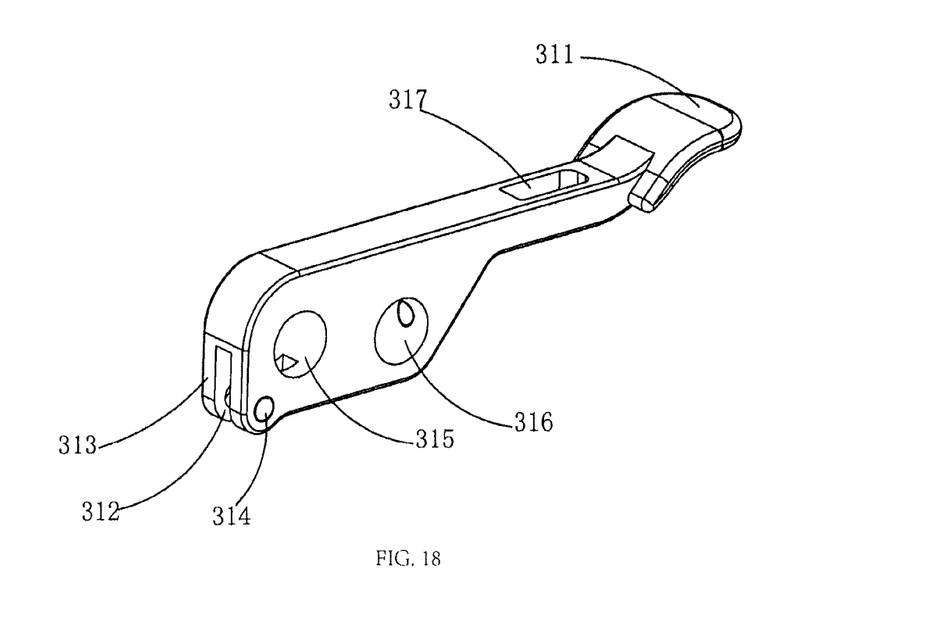
FIG. 18 is a perspective structure schematic view of the spanner according to a specific embodiment of the present invention.

As shown in FIG. 18, one end of the spanner 31 is provided with a handgrip 311, the operator applies force through the handgrip 311, the other end of the spanner 31 defines a spanner rotation shaft mounting hole 315 to be inserted by the spanner rotation shaft 34. As shown in FIGS. 4 and 5, the spanner 31 is rotatably mounted to the spanner rotation shaft holes 304 on the two side walls 301 of the right seat body 30 by inserting the spanner rotation shaft 34 into spanner rotation shaft mounting hole 315.

As shown in FIGS. 4 and 5, one end of the drag hook is rotatably connected to the spanner 31 through the drag hook rotation shaft 35. Specifically, a drag hook rotation shaft hole 316 is defined between the handgrip 311 and the spanner rotation mounting hole 315. The specific structure of the drag hook 32 is shown in FIG. 16, one end of the drag hook 32 defines a drag hook rotation shaft mounting hole 323. As shown in FIGS. 4 and 5, the drag hook 32 is rotatably connected to the spanner 31 by the drag hook rotation shaft 35 through the drag hook rotation shaft hole 316 and the drag hook rotation shaft mounting hole 323.

Figure 17:
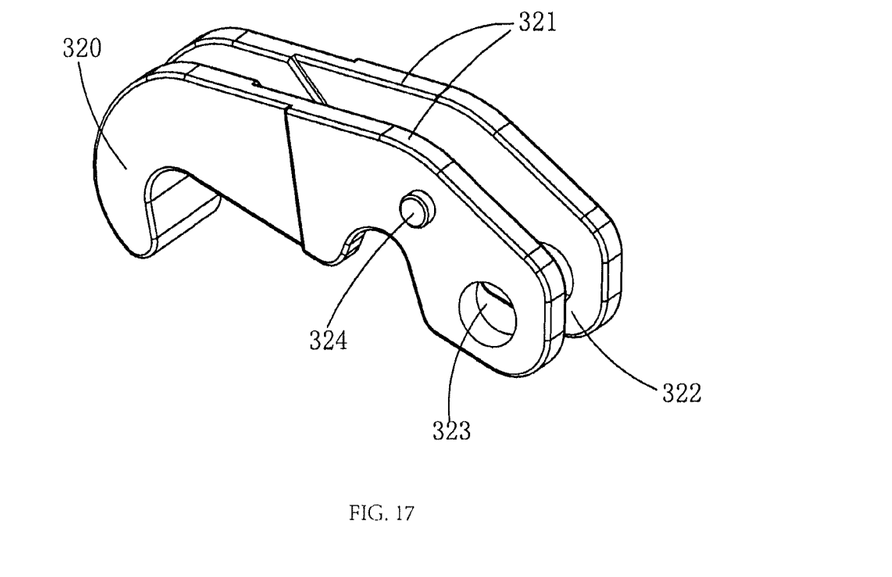
FIG. 17 is a perspective structure schematic view of the drag hook according to a specific embodiment of the present invention.

As shown in FIG. 17, the other end of the drag hook 32 is provided with a hook 320, the drag hook 32 can hook the locking column 21 through the hook 320, such that the left assembly 2 and the right assembly 3 are connected together as shown in FIGS. 2 and 4.

Figure 19:
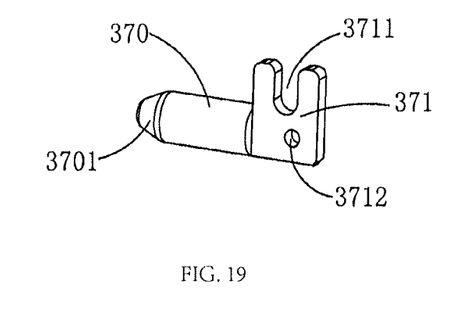
FIG. 19 is a perspective structure schematic view of the positioning column according to a specific embodiment of the present invention.

As shown in FIGS. 4 and 5, the positioning column 37 may be slidably disposed in the right seat body 30, and may be rotatably and slidably connected to the spanner 31 through the positioning column connecting shaft 38. The specific structure of the positioning column 37 is shown in FIG. 19, the positioning column 37 comprises a positioning column body 370 and a connecting piece 371 fixedly connected to a rear end of the positioning column body 370. Actually the connecting piece 371 and the positioning column body 370 may be formed in a whole, or may be connected together through welding. A front end of the positioning column body 370 is provided with a conical surface 3701 that plays a guide role. The connecting piece 371 is provided with a waist-shaped hole 3711 thereon and is connected to the spanner 31 through the positioning column connecting shaft 38. As shown in FIG. 17, the front end of the spanner 31 is provided with a connecting piece accommodating groove 312, such that a connecting wall 313 is respectively formed on the two sides of the connecting piece accommodating groove 312, and the connecting wall 313 defines a positioning column connecting shaft hole 314 for mounting the positioning column connecting shaft 38. After assembled, the positioning column 37 is in the positioning column accommodating hole 303, and may be slid along the positioning column accommodating hole 303 under the drive from the spanner 31. When the drag hook 32 hooks the locking column 21, as shown in FIGS. 4 and 5, the positioning column is inserted into the positioning column hole 201 of the rotation angle seat 21, thereby positioning the left assembly 2 and right assembly 3 in the y-direction and the z-direction.

The unlock state is shown in FIGS. 3 and 5, the spanner 31 is thrown through the handgrip 311 on one end of the spanner 31, such that the spanner 31 is rotated about the axis of the spanner rotation shaft 34, thereby generating a leverage effect, so as to generate a larger force to drive the drag hook 32 and the positioning column 37 to move, such that the hook 320 of the drag hook 32 hooks the locking column 21 of the rotation angle seat 20. Meanwhile, the positioning column 37 is inserted into the positioning column hole 201 of the rotation angle seat 20, thereby locking the left assembly 1 and the right assembly 3. The lock state is shown in FIGS. 1 and 4. At that time, the X-direction left positioning surface 200 clings with the X-direction right positioning surface 300, such that the left assembly 2 and the right assembly 3 are positioned in the X-direction. Or the spanner 31 is thrown in a reverse direction, then the drag hook 32 escapes from the locking column 21, the positioning column 37 returns back into the right seat body 30, such that the left assembly 2 escapes from right assembly 3. The unlock state is shown in FIG. 3.

In conclusion, after the left assembly 2 and the right assembly 3 are locked, the left assembly 2 and the right assembly 3 are accurately positioned in the X-direction, Y-direction and Z-direction. And the left assembly 2 and the right assembly 3 are fixedly connected to two display units 1 respectively, such that the accurate positioning and reliable connection between two adjacent display units may be achieve. And the connection may be operated through the spanner 31, which can achieve the quick assembly and the disassembly.

In a preferred technical solution, a guide mechanism is disposed between the drag hook 32 and the right seat body 30, such that under the drive of the spanner 31 the drag hook 32 can keep stable by itself and moves with a good posture so as to hook the locking column 21 or escape from the locking column 21. Specifically, when the drag hook 32 escapes from the locking column 21, first the drag hook 32 moves to the left away from the locking column 21, meanwhile the drag hook 32 has a motion of rising. After the drag hook 32 is separated from the locking column 21 completely, the drag hook moves to the right to reset.

In this specific embodiment, the guide mechanism comprises guide pins 324 disposed on the two sides of the drag hook 32 as show in FIG. 17 and guide grooves 302 disposed on the two side walls 301 of the right seat body 30 as shown in FIGS. 15 and 16. When the drag hook 32 moves, the guide pin 324 slides in the guide groove 302, thereby ensuring the motion posture of the drag hook 32. The motion posture of the drag hook 32 mainly refers to the motion posture of the hook 320 on the front end of the drag hook 32. As shown in FIG. 17, the middle part of the rear end of the drag hook 32 is emptied to form an avoidance notch 322, two connecting arms 321 are naturally formed on the two sides of the avoidance notch 322. After assembled, the spanner 31 is arranged in the avoidance notch 322, and the avoidance notch 322 is rotatably connected to the spanner 31 through the drag hook rotation shaft mounting hole 323.

As shown in FIGS. 3 and 15, in the preferred technical solution, the right assembly 3 further comprises a safety mechanism 36, the safety mechanism 36 is disclosed between a moving part and a stationary part of the right assembly 3. When the left assembly 2 is locked with the right assembly 3, the safety mechanism 36 locks the moving part of the right assembly 3, to prevent the left assembly 2 from escaping from the right assembly 3 under the action of outside factors, such that the lock state is more stable. The moving part mainly refers to the spanner 31, drag hook 32, positioning column 37, positioning column connecting shaft 38, drag hook rotation shaft 35 and other movable parts. The stationary part mainly refers to the right seat body 30 and the spanner rotation shaft 34. In this specific embodiment, the spanner 31 is locked by the safety mechanism 36. However, the drag hook 32 or the positioning column 37 may be locked to achieve the same effect. In this embodiment locking the spanner 31 is the most convenient, and the effect is the best.

As shown in FIGS. 3 and 15, the safety mechanism 36 of this specific embodiment comprises a safety buckle 360, a safety buckle reset member 361 and a safety buckle rotation shaft 362. The safety buckle 360 is rotatably arranged into the two safety buckle rotation shaft holes 305 of the right seat body 30 through the safety buckle rotation shaft 362. In this specific embodiment, the safety buckle reset member 361 is a reset spring, the reset spring is disposed around the safety buckle rotation shaft 362, and elastically acts between the safety buckle 360 and the right seat body 30, such that the safety buckle 360 may clamp the spanner 31 when the left assembly 2 and the right assembly 3 are in the lock state, such that the left assembly 2 and the right assembly 3 are locked reliably.

Figure 20:
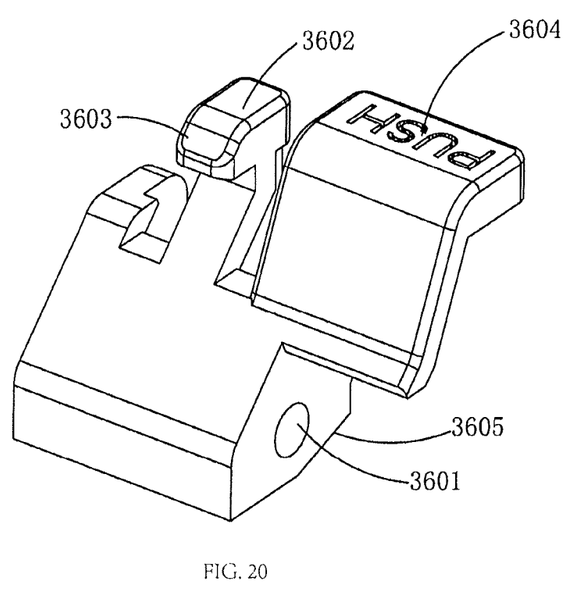
FIG. 20 is a perspective structure schematic view of the safety buckle according to a specific embodiment of the present invention.

The specific structure of the safety buckle 360 is shown in FIG. 20, a lower end of the safety buckle 360 defines a safety buckle rotation shaft mounting hole 3601, an upper end of the safety buckle 360 is provided with a clamp hook 3602. The clamp hook 3602 of the safety buckle 360 locks the spanner 31. As shown in FIG. 17, the middle portion of the spanner 31 defines a clamping hook hole 317 corresponding to the clamping hook 3602 of the safety buckle 360. The clamping hook 3602 comprises a guide slant 3603, such that when the right assembly 3 and the left assembly 2 are in the lock state, the clamp hook 3602 hooks the spanner 31 and enters the safety state.

In a further preferred technical, the safety buckle 360 comprises a pressing surface 3604. If the safety state needs to be terminated, the pressing surface 3604 can be pressed, then the safety buckle 360 can overcome the action of the reset member 361 to rotate about the safety buckle rotation shaft 362 and the clamp hook 3602 breaks away from the spanner 31, therefore the safety state may be terminated easily.

The further preferred technical solution is shown in FIG. 4 and FIG. 5. The device for quick splicing of a display screen further comprises an open state remaining member 39. The open state remaining member 39 is also disposed between the moving part and the stationary part of the right assembly 3. The open state remaining member 39 can make the right assembly 3 be kept in the maximum open state when the drag hook 32 doesn't hook the locking column 21, this is to ensure that the positioning column 37 returns back to the right seat body 30 completely, in order to avoid affecting the right assembly 3 approaching to the left assembly 2. After the right assembly 3 and the display unit fixedly connected to the right assembly 3 get close to the left assembly 2 and the corresponding display unit, and the X-direction left positioning surface 200 correspondingly contacts the X-direction right positioning surface 300, the two display units may be locked together only by pressing the handgrip 311 of the spanner 311, the operation is very convenient.

In this specific embodiment, the open state remaining member 39 is a tension spring which is stretched to act between the positioning column 37 and the right seat body 30 and pulls the positioning column 37 into the right seat body 30, to ensure that the positioning column 37 doesn't protrude above the X-direction right positioning surface 300 in the unlock state.

The device for quick splicing of a display screen of the present invention can splice the display screens together quickly without any tool, and thus can be flexible to adapt to various application situations. And the main parts, comprising the rotation angle seat 21, right seat body 30, drag hook 32, spanner 31 and safety buckle 360, may be manufactured through the die casting process cooperated with the machining process, and the manufacturing precision of the contact parts may be within 0.02 mm. And through the innovative structure design that transfers the contact parts, the damage caused by the squeeze of two adjacent display units may be prevented, which is adapted to the display application of high density of pixels. The contact parts for assembly is precisely machined and is applied a processing technology control, the ideal effect of splicing can be achieved. After assembled, the total error may be controlled to be within the range of 0.1 mm, which improves the splicing precision by one order of magnitude, thereby achieving quick and accurate assembly and locking.

The above content is to explain the prevent invention further with reference to the specific preferred embodiment, it can't be determined the specific embodiment of the prevent invention is only limited to these illustrations. Some simple deductions or replacements made by those ordinary skilled person in the art without escaping from the conception of the prevent invention, should be regarded as falling into the protection scope of the present invention.

What is claimed is:

1. A device for quick splicing of a display screen, comprising:
   a left assembly and a right assembly, the left assembly and the right assembly being lockable with each other,
   the left assembly comprising:
      a rotation fixing seat, a rotation angle seat, and a rotation locking mechanism, the rotation angle seat being lockable with the right assembly and being rotatably connected to the rotation fixing seat, the rotation locking mechanism being disposed between the rotation fixing seat and the rotation angle seat, wherein when the rotation locking mechanism is unlocked, the rotation angle seat rotates relative to the rotation fixing seat;
   and when the rotation locking mechanism is locked, the rotation angle seat is fixedly connected to the rotation fixing seat;
   wherein the device for quick splicing of a display screen further comprises:
      a step angle-adjusting and clamping mechanism, the step angle-adjusting and clamping mechanism being disposed between the rotation angle seat and the rotation fixing seat,
   wherein the rotation angle seat is provided with an arc-shaped flange, and the rotation fixing seat is correspondingly provided with an arc-shaped flange guiding slot, the arc-shaped flange is slidable in the arc-shaped flange guiding slot, such that the rotation fixing seat and the rotation angle seat are rotatable with respect to each other,
   the rotation locking mechanism comprises a locking plate and a locking driving mechanism, the locking plate defines three holes, the rotation fixing seat is provided with a guide column, the locking plate is inserted by the guide column, through one of the holes, the locking plate is slidably disposed on the guide column of the rotation fixing seat;

the step angle-adjusting and clamping mechanism comprises arc-shaped tooth portions disposed on one side of the locking plate and accordingly disposed on one side of the arc-shaped flange of the rotation angle seat; and the step angle-adjusting and clamping mechanism drives the locking plate toward the rotation angle seat, such that the arc-shaped tooth portions of the locking plate and the rotation angle seat engage with each other to prevent the rotation fixing seat from rotating with respect to the rotation angle seat.

2. The device for quick splicing of a display screen of claim 1, wherein the device for quick splicing of a display screen further comprises an angle indication mechanism indicating a relative rotation angle of the rotation fixing seat and the rotation angle seat, and the angle indication mechanism is disposed between the rotation fixing seat and the rotation angle seat.

3. The device for quick splicing of a display screen of claim 2, wherein the angle indication mechanism comprises an angle pointer fixedly disposed on the rotation angle seat, and an angle reading disposed on an outer side curved surface of the arc-shaped flange guiding slot of the rotation fixing seat.

4. The device for quick splicing of a display screen of claim 3, wherein the angle indication mechanism further comprises a plurality of pointer slots disposed on the outer side curved surface of the arc-shaped flange guiding slot, the pointer slots are disposed on one side of the angle reading and are corresponding to the scales of the angle reading, and the angle pointer is an elastic angle pointer.

5. The device for quick splicing of a display screen of claim 1, wherein the left assembly further comprises a locking reset mechanism configured for making the rotation angle seat and the rotation fixing seat disengage automatically from each other and enter into a relative rotation state when the rotation locking mechanism is unlocked, the locking reset mechanism is disposed between the rotation angle seat and the rotation fixing seat.

6. The device for quick splicing of a display screen of claim 1, wherein the left assembly further comprises a rotation limiting mechanism restricting the rotation fixing seat and the rotation angle seat in a definite range, the rotation limiting mechanism is disposed between the rotation fixing seat and the rotation angle seat.

7. The device for quick splicing of a display screen of claim 6, wherein the rotation limiting mechanism comprises a limiting screw and a limiting groove respectively disposed on the rotation fixing seat and the rotation angle seat; when the rotation fixing seat rotates with respective to the rotation angle seat and reaches a limiting position, the limiting screw contacts with the limiting groove to define the limiting position that the rotation fixing seat can rotate with respective to the rotation angle seat.

8. A device for quick splicing of a display screen, comprising:

a left assembly and a right assembly, the left assembly and the right assembly being lockable with each other, the left assembly comprising:

a rotation fixing seat, a rotation angle seat, and a rotation locking mechanism, the rotation angle seat being lockable with the right assembly and being rotatably connected to the rotation fixing seat, the rotation locking mechanism being disposed between the rotation fixing seat and the rotation angle seat, wherein when the rotation locking mechanism is unlocked, the rotation angle seat rotates relative to the rotation fixing seat;

and when the rotation locking mechanism is locked, the rotation angle seat is fixedly connected to the rotation fixing seat;

wherein the device for quick splicing of a display screen further comprises:

a step angle-adjusting and clamping mechanism, the step angle-adjusting and clamping mechanism being disposed between the rotation angle seat and the rotation fixing seat, wherein the device for quick splicing of a display screen further comprises an angle indication mechanism indicating a relative rotation angle of the rotation fixing seat and the rotation angle seat, and the angle indication mechanism is disposed between the rotation fixing seat and the rotation angle seat;

wherein the angle indication mechanism comprises an angle pointer fixedly disposed on the rotation angle seat, and an angle reading disposed on an outer side curved surface of the arc-shaped flange guiding slot of the rotation fixing seat; and wherein the angle indication mechanism further comprises a plurality of pointer slots disposed on the outer side curved surface of the arc-shaped flange guiding slot, the pointer slots are disposed on one side of the angle reading and are corresponding to the scales of the angle reading, and the angle pointer is an elastic angle pointer.

* * * * *